US008916479B1

(12) United States Patent
Nowling

(10) Patent No.: US 8,916,479 B1
(45) Date of Patent: Dec. 23, 2014

(54) SELECTIVE ETCHING OF TITANIUM NITRIDE

(71) Applicant: Intermolecular Inc., San Jose, CA (US)

(72) Inventor: Gregory Nowling, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/913,672

(22) Filed: Jun. 10, 2013

(51) Int. Cl.
*H01L 21/461* (2006.01)
*H01L 21/3213* (2006.01)

(52) U.S. Cl.
CPC .............................. *H01L 21/32134* (2013.01)
USPC .............. 438/754; 216/37; 216/67; 252/79.1; 252/79.2; 252/79.3; 252/79.4

(58) Field of Classification Search
USPC .................... 438/754; 216/37, 67, 79.1–79.4; 252/79.1–79.4
See application file for complete search history.

(56) References Cited

U.S. PATENT DOCUMENTS

| | | | |
|---|---|---|---|
| 4,676,866 A | 6/1987 | Tang | |
| 5,847,463 A * | 12/1998 | Trivedi et al. | 257/751 |
| 6,200,910 B1 * | 3/2001 | O'Brien et al. | 438/755 |
| 7,354,868 B2 | 4/2008 | Kwon | |
| 7,659,156 B2 * | 2/2010 | Thean et al. | 438/197 |
| 7,998,914 B2 * | 8/2011 | Shimada et al. | 510/175 |
| 2001/0037995 A1 | 11/2001 | Akatsu | |
| 2004/0080024 A1 | 4/2004 | Datta | |
| 2013/0048904 A1 | 2/2013 | Adaniya | |

FOREIGN PATENT DOCUMENTS

| | | |
|---|---|---|
| JP | 2008191624 A | 8/2008 |
| WO | WO-2013-062819 A | 5/2013 |

OTHER PUBLICATIONS

Chen et al; TaTiN midgap fullmetal single gate fabrication using combined chlorinebased plasma and highly selective chemical metal etching for decananometer CMOS technology; ; Science Direct.

* cited by examiner

*Primary Examiner* — Lan Vinh
*Assistant Examiner* — Maki Angadi

(57) ABSTRACT

Provided are methods for processing semiconductor substrates having titanium nitride (TiN) structures as well as aluminum (Al) structures and, in some embodiments, other structures, such as silicon germanium (SiGe), tantalum nitride (TaN), hafnium oxide (HfOx), silicon nitride (SiN), and/or silicon oxide ($SiO_2$) structures. Etching solutions and processing conditions described herein provide high etching selectivity of titanium nitride relative to these other materials. As such, the titanium nitride structures can be removed (partially or completely) without significant damage to these other structures. In some embodiments, the etching rate of titanium nitride is at least about 200 Angstroms per minute and even at least about 350 Angstroms per minute, while the etching rate of aluminum and/or other materials is less than 15 Angstroms per minute. An etching solution may be kept at 40° C. to 65° C. and may include ammonium hydroxide and hydrogen peroxide (between 1:600 and 1:3,000 by weight).

20 Claims, 3 Drawing Sheets

↓ *Etching*

SELECTIVE ETCHING OF TITANIUM NITRIDE

BACKGROUND

Semiconductor devices have dramatically decreased in size in recent years. Some modern devices include features that are less than 100 nanometers in size, e.g., 45 nanometers and/or 32 nanometers. As device and feature sizes continue to shrink, processing methods and materials need to be improved.

Titanium nitride has various applications in the semiconductor industry, such as hard masks, metal barriers, conductive electrodes, metal gates, and many others. Its widespread use is attributed in part by good metal diffusion blocking characteristics and low resistivity of about 30-70 micro Ohm-cm after annealing. Some new 45 nanometer chip configurations and beyond make use of titanium nitride for improved transistor performance. Titanium nitride structures may be provided on the same substrate with aluminum structures that may be used as work function materials and/or contacts.

SUMMARY

Provided are methods for processing semiconductor substrates having titanium nitride (TN) structures as well as aluminum (Al) structures and, in some embodiments, other structures, such as silicon germanium (SiGe), tantalum nitride (TaN), hafnium oxide (HfOx), silicon nitride (SiN), and/or silicon oxide ($SiO_2$) structures. Etching solutions and processing conditions described herein provide high etching selectivity of titanium nitride relative to these other materials. As such, the titanium nitride structures can be removed (partially or completely) without significant damage to these other structures. In some embodiments, the etching rate of titanium nitride is at least about 200 Angstroms per minute and even at least about 350 Angstroms per minute, while the etching rate of aluminum and/or other materials is less than 15 Angstroms per minute. An etching solution may be kept at 40° C. to 65° C. and may include ammonium hydroxide and hydrogen peroxide (between 1:600 and 1:3,000 by weight).

In some embodiments, a method for processing semiconductor substrates involves providing a semiconductor substrate having a first structure and a second structure. The first structure includes titanium nitride, while the second structure includes aluminum. The method continues with exposing the semiconductor substrate to an etching solution. The etching solution includes ammonium hydroxide and hydrogen peroxide with the weight ratio of ammonium hydroxide to hydrogen peroxide being between 1:600 and 1:3,000 or, more specifically, between 1:1,000 and 1:3,000 or even between 1:1,500 and 1:3,000. Some ammonium hydroxide is added to provide catalytic effects. However, the amount of ammonium hydroxide is substantially less than the amount of hydrogen peroxide in order to preserve aluminum. The method continues with etching the first structure such that the etching rate of the first structure is greater than an etching rate of the second structure. In some embodiments, the first structure is completely removed without substantial impact to the second structure. For example, the thickness of the second structure may decrease by less than 5% during the etching of the first structure.

In some embodiments, the etching rate of the first structure is between 200 Angstroms per minute and 2,000 Angstroms per minute or, more specifically, between 350 Angstroms per minute and 2,000 Angstroms per minute. The etching rate of the second structure may be less than 15 Angstroms per minute or even less than 10 Angstroms per minute. In some embodiments, the etching selectivity of the second structure to the first structure is less than 0.05 or, more specifically, less than 0.03. The etching selectivity is defined as a ratio of two etching rates.

The etching solution may also include water at a concentration of between 50% and 80% by weight. In some embodiments, the concentration of water in the etching solution is less than 50% by weight and even less than 40% by weight. A more concentrated solution may yield higher etching rates of titanium nitride and high throughput. However, etching selectivity may be negatively affected by higher concentrations. Another factor that impacts the etching rates and selectivity is the temperature of the etching solution. In some embodiments, the etching solution is held at a temperature of between 25° C. and 80° C. during etching or, more specifically, at between 40° C. and 65° C. or even at between 50° C. and 60° C. during etching.

In some embodiments, the semiconductor substrate also includes a third structure made from one of silicon germanium, tantalum nitride, hafnium oxide, silicon nitride, or silicon dioxide. The etching rate of the third structure may be less than 15 Angstroms per minute or, more specifically, less than 6 Angstroms per minute. In a specific example, the third structure is made of silicon germanium. In some embodiments, the first structure may be a part of a hard mask. The second structure may be a transistor contact and/or a work function modulation layer. In some embodiments, the etching solution also includes 2-(2-aminoethoxy)ethanol, hydroxylamine, and catechol. These materials may be used for removing of etching residues from trenches and other high aspect ratio features.

Provided also is a method for processing semiconductor substrates that involves providing a semiconductor substrate having an aluminum structure and a titanium nitride structure, exposing the semiconductor substrate to an etching solution, and etching the titanium nitride structure such that an etching selectivity of the aluminum structure to the titanium nitride structure is less than 0.03. The etching solution includes ammonium hydroxide and hydrogen peroxide with the weight ratio of ammonium hydroxide to hydrogen peroxide is between 1:1,000 and 1:3,000. The solution is kept at a temperature of between 40° C. and 65° C.

These and other embodiments are described further below with reference to the figures.

DETAILED DESCRIPTION OF EXAMPLE EMBODIMENTS

Figure 1A:
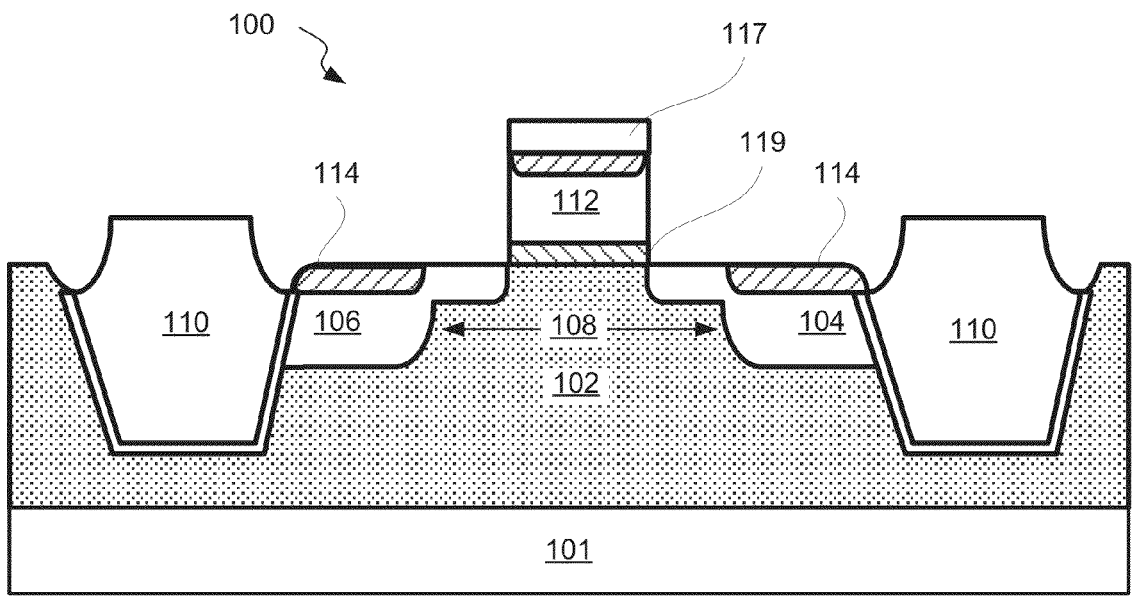
FIGS. 1A and 1B illustrate schematic representations of semiconductor substrate portions before and after etching of a titanium nitride structure, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

Hard mask films are often used as an aid in critical patterning applications for back-end-of-line (BEOL) inter-level dielectric (ILD) materials. These hard mask films may be designed to have a high etching selectivity with respect to the ILD material, be compatible with basic lithography processes, and be capable of removal without damaging the underlying ILD layer. Titanium nitride has a high etching selectivity with respect to ILD and is often used as a metallic hard mask. Once the mask is used, it needs to be removed in a fast manner without damaging other components on the substrate, such as aluminum components used as contacts and work function modulation layers. Other materials, such as silicon germanium, tantalum nitride, hafnium oxide, silicon nitride, and/or silicon dioxide components, may be also exposed to an etching solution during removal of titanium nitride structures. Various conventional processes used to remove titanium nitrides are often damaging to many materials on the substrate, in particular aluminum. While the reference is made to the use of titanium nitride as a hard mask, other uses of titanium nitride that require partial or complete removal of titanium nitride structures are also within the scope.

While hydrogen peroxide is an effective etchant for titanium nitride, the etching rates achieved at commonly used processing temperatures (e.g., less than 65° C.) are insufficient to remove thick titanium nitride layers in a short period of time. For example, the etching rate of a water based hydrogen peroxide solution (30% by weight of $H_2O_2$ at 40° C.) is only 76.2 Angstroms per minute. It has been unexpectedly found that ammonium hydroxide acts as a catalyst during etching of titanium nitride using hydrogen peroxide. However, ammonium hydroxide may be damaging to other components when used at high concentrations. For example, combining a water based hydrogen peroxide solution (30% by weight of $H_2O_2$) and a water based ammonium hydroxide solution (25% by weight of $NH_4OH$) at a 1:20 weight ratio of $NH_4OH:H_2O_2$ yields an aluminum etching rate of 135 Angstroms per minute at a processing temperature of 65° C. It has been further found that the aluminum etching rate can be substantially decreased by using much lower concentrations of ammonium hydroxide without significantly sacrificing the titanium nitride etching rates. In other words, it has been found that addition of ammonium hydroxide provides catalytic effects even at very low concentrations. In fact, combining a water based hydrogen peroxide solution (30% by weight of $H_2O_2$) and a water based ammonium hydroxide solution (25% by weight of $NH_4OH$) at a 1:1000 by volume (i.e., 1 part volume of $H_2O_2$ to 1,000 parts volume of $NH_4OH$) at 40° C. yields a titanium nitride etching rate of 236 Angstroms per minute. Adding more ammonium hydroxide to the etching solution at this temperature does not seem to change the titanium nitride etching rate, which is consistent with the catalytic effect phenomenon.

Provided etching methods utilize etching solutions that include ammonium hydroxide and hydrogen peroxide at a weight ratio of between 1:600 and 1:3,000. Ammonium hydroxide and hydrogen peroxide may be dissolved in water, such that the concentration of water in the etching solutions may be between 50% and 80% by weight. The etching solutions are suitable for processing semiconductor substrates having titanium nitride (TiN) structures as well as aluminum (Al) structures and, in some embodiments, other structures, such as silicon germanium (SiGe), tantalum nitride (TaN), hafnium oxide (HfOx), silicon nitride (SiN), and/or silicon oxide ($SiO_2$) structures. These etching solutions provide high etching selectivity of titanium nitride relative to these other materials. As such, the titanium nitride structures can be removed without significant damage to these other structures. In some embodiments, the etching rate of titanium nitride is at least about 200 Angstroms per minute and even at least about 350 Angstroms per minute, while the etching rate of aluminum is less than 15 Angstroms per minute.

Semiconductor Device Examples

Figure 1B:
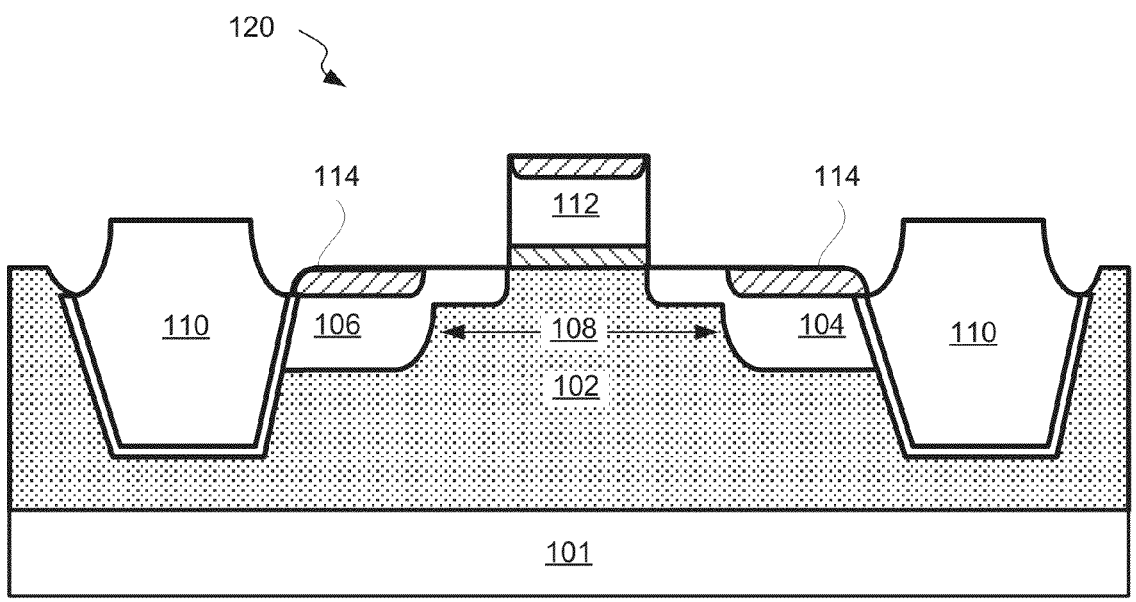

A brief description of semiconductor device examples is presented below to provide better understanding of various features of titanium nitride etching. Specifically, FIGS. 1A and 1B illustrate schematic representations of substrate portions including MOS device 100 before removal of titanium nitride mask 117 and the same device 120 after such removal, in accordance with some embodiments. The references below are made to positive metal-oxide semiconductor (PMOS) devices but other types of MOS devices can be used in the described processes and will be understood by one having ordinary skill in the art. MOS device 100 includes a p-doped substrate 101 and an n-doped well 102 disposed within substrate 101. Substrate 101 is typically a part of a wafer that may include other devices and components. Some of these other components may be made of aluminum, silicon germanium, tantalum nitride, hafnium oxide, silicon oxide, and/or silicon nitride and may be also exposed to an etching solution during removal of titanium nitride mask 117.

P-doped substrate 101 may include any suitable p-type dopants, such as boron and indium, and may be formed by any suitable technique. N-doped well 102 may include any suitable n-type dopants, such as phosphorus and arsenic, and may be formed by any suitable technique. For example, n-doped well 102 may be formed by doping substrate 101 by ion implantation, for example.

MOS device 100 also includes a conductive gate electrode 112 that is separated from n-doped well 102 by gate dielectric 119. Gate electrode 112 may include any suitable conductive material. In one embodiment, gate electrode 112 may comprise polysilicon. In another embodiment, gate electrode 112 may include polysilicon doped with a p-type dopant, such as boron. Gate dielectric 119 is formed from hafnium oxide or other suitable material. Hafnium oxide has a very high a dielectric constant and a large conduction band offset with respect to silicon as described above. In some embodiments, a work function modulation layer (not specifically shown) may be provided between gate dielectric 119 and gate electrode 112. The work function modulation layer may be made from aluminum and some of the work function modulation layer may be exposed to an etching solution when a substrate containing MOS device 100 is submerged into the solution.

MOS device 100 also includes p-doped source region 104 and drain region 106 (or simply the source and drain) disposed in n-doped well 102. Source 104 and drain 106 are located on each side of gate electrode 112 forming channel 108 within n-doped well 102. Source 104 and drain 106 may include a p-type dopant, such as boron. Source 104 and drain 106 may be formed by ion implantation. After forming source 104 and drain 106, MOS device 100 may be subjected to an annealing and/or thermal activation process, which may impact etching characteristics of various components.

In some embodiments, source 104 and/or drain 106 include conductive portions 114 that may be made from aluminum.

These conductive portions 114 may be exposed to an etching solution when a substrate containing MOS device 100 is submerged into the solution.

MOS device 100 may also include STI structures 110 disposed on both sides of source 104 and drain 106. STI structures 110 may include liners formed on the side and bottom walls by, for example, thermal oxidation of silicon of n-doped well 102. The main body of an STI structure is formed by filling a trench within n-doped well 102 with a dielectric material such as silicon oxide. The trench may be filled with the dielectric material using high density plasma (HDP) deposition process.

Other devices that include aluminum structures and titanium structures are also within the scope of this disclosure. In some embodiments, aluminum structures and titanium structures are positioned on the same substrate but are not parts of the same device.

Processing Examples

Figure 2:
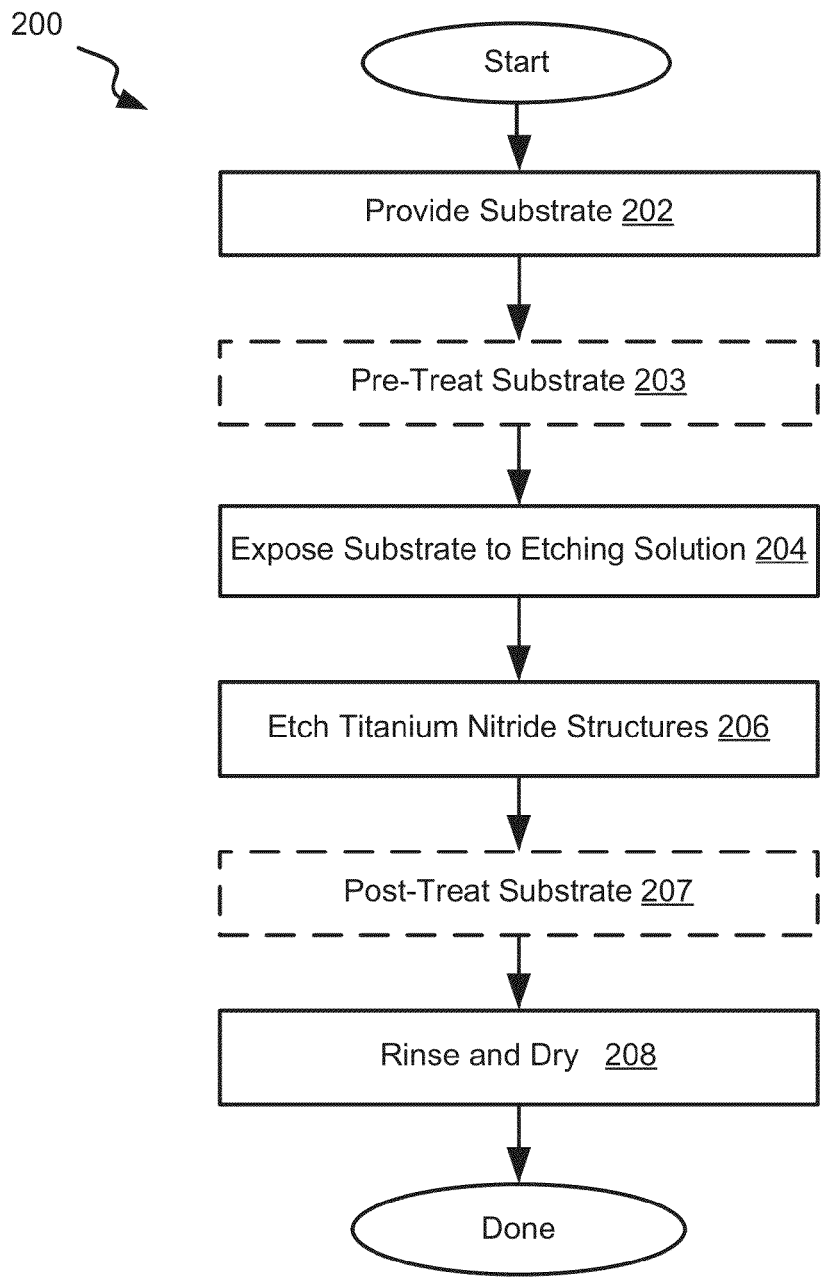
FIG. 2 illustrates a process flowchart corresponding to a method of processing a semiconductor substrate to etch one or more titanium nitride structures, in accordance with some embodiments.

FIG. 2 illustrates a process flowchart corresponding to method 200 of processing a semiconductor substrate to etch titanium nitride structures, in accordance with some embodiments. Method 200 may commence with providing a semiconductor substrate that includes at least one titanium nitride structure and at least one aluminum structure during operation 202. Some examples of such a substrate are described above with reference to FIGS. 1A and 1B. In some embodiments, the substrate has one or more additional structures that include one of silicon germanium, tantalum nitride, hafnium oxide, silicon nitride, and/or silicon dioxide. The one or more titanium nitride structures may be formed by atomic layer deposition (ALD), chemical vapor deposition (CVD), and/or physical vapor deposition (PVD). The one or more aluminum structures may be deposited using PVD and/or electroplating. Other deposition techniques are also within the scope of this invention. For example, a titanium nitride structure may be formed using PVD or ALD. Likewise, an aluminum structure may be formed using PVD or ALD. Without being restricted to any particular theory, ALD deposited titanium nitride is expected to etch more slowly than PVD deposited titanium nitride, e.g., at about half the speed of the PVD titanium nitride.

In some embodiments, method 200 involves an optional pre-treatment operation 203. The pre-treatment operation may be used to form a protective layer over aluminum and/or other structures that should be protected during etching of titanium nitride. In some embodiments, the pre-treatment operation is used to remove residues from trenches and other high aspect ratio features and exposed titanium nitride surface. For example, operation 203 may involve exposing the surface of the substrate to a cleaning material, such as EKC-575 Post-Etch Residue Remover™ available from Du Pont-EKC Technology Inc. in Hayward, Calif.

Method 200 may proceed with exposing the semiconductor substrate to an etching solution during operation 204. Specifically, the etching solution comes in contact with the titanium nitride structure and the aluminum structure. In some embodiments, the aluminum structure may not be directly or intentionally exposed to the etching solution. Some exposure may result from other components covering the aluminum structure being misaligned and/or permeable to the etching solution.

The etching solution includes ammonium hydroxide and hydrogen peroxide. The weight ratio of ammonium hydroxide to hydrogen peroxide may be between 1:600 and 1:3,000 or, more specifically, between 1:1,000 and 1:3,000 or between 1:1,000 and 1:1,500, such as 1:1,200. In some embodiments, the weight ratio of ammonium hydroxide to hydrogen peroxide is about 1:600, about 1:900, about 1:100, about 1:1,200, or about 1:1,500.

Without being restricted to any particular theory, experimental results appear to suggest that hydrogen peroxide is predominantly responsible for etching titanium nitride while ammonium hydroxide provides some catalytic effects. At the same time, ammonium hydroxide tends to etch aluminum and, therefore, its concentration should be kept to a minimum.

The solution may include one or more solvents, such as water. In some embodiments, the concentration of water in the etching solution is between about 50% and 80% by weight, such as about 70% by weight. The concentration of water has a significant impact on the etching rates, i.e., higher etching rates corresponding to more concentrated solutions. In some embodiments, the concentration of water in the etching solution may be less than 50% by weight and even less than 40% by weight.

In some embodiments, the etching solution may include other components, such as cleaning materials for removing various residues (e.g., etching residues) from trenches and other high aspect ratio features. For example, the etching solution may include one or more of 2-(2-aminoethoxy)ethanol, hydroxylamine, or catechol. A specific example of a cleaning material includes EKC-575 Post-Etch Residue Remover™ available from Du Pont-EKC Technology Inc. in Hayward, Calif. However, instead of using this cleaning material after the etching operation, as it is conventionally done, the cleaning material may be added directly into the etching solution. In some embodiments, the weight concentration of a cleaning material the cleaning solution may be between about 5% and 15%, such as about 10%.

The etching solution may be maintained at a temperature between about 25° C. and 80° C. while etching the first structure. In some embodiments, the temperature of the etching solution is maintained between about 40° C. and 65° C. or even between about 50° C. and 60° C. While higher temperatures may result in faster etching of the first structure, the selectivity may be negatively affected. Furthermore, elevated temperatures may cause evaporation of a solvent (e.g., water) and change the composition of the solution. The impact of the temperature is further described below in the experimental results section.

Method 200 may proceed with etching the titanium nitride structure during operation 206. The titanium nitride etching rate may be greater than the aluminum etching rate. In other words, the etching selectivity of the aluminum structures to the titanium nitride structure is less than 1. In some embodiments, this selectivity is less than about 0.1, less than 0.05, or even less than 0.03. The titanium nitride etching rate may be also greater than etching rates of other structures, e.g., silicon germanium structures, tantalum nitride structures, hafnium oxide structures, silicon nitride structures, or silicon dioxide structures. In some embodiments, the titanium nitride structures may be completely removed without substantial deterioration of other structures, e.g., the aluminum structure may lose less than 5% of its thickness.

In some embodiments, the titanium nitride etching rate is between 200 Angstroms per minute and 2,000 Angstroms per minute or, more specifically, between 350 Angstroms per minute and 2,000 Angstroms per minute. The etching rate of aluminum may be less than 15 Angstroms per minute or even less than 10 Angstroms per minute. In some embodiments, the semiconductor substrate includes a structure made of silicon germanium, tantalum nitride, hafnium oxide, silicon nitride, or silicon dioxide. The etching rate of this structure may be less than 15 Angstroms per minute or, more specifically, less than 10 Angstroms per minute.

In some embodiments, after exposing the substrate to the etching solution and etching the titanium nitride structures, one or more post-treatment operations may be performed, shown as optional operation 207 in FIG. 2. These post-treatment operations may be specifically designed to remove etching residues from trenches and other high aspect ratio features. In some embodiments, post-treatment operation 207 involves submerging a substrate into a cleaning material such as EKC-575 Post-Etch Residue Remover™ available from Du Pont-EKC Technology Inc. in Hayward, Calif.

After completion of operation 206 and optionally operation 207, method 200 may proceed with rinsing and drying the substrate during operation 208. The residual etching solution is removed from the substrate surface during this operation by, for example, rinsing the surface with deionized water and drying with an inert gas, such as nitrogen or argon.

Experimental Results

Various experiments have been conducted to determine effects of different processing conditions and compositions of etching solutions on selectivity and etching rates. Specifically, different weight ratios ammonium hydroxide to hydrogen peroxide and temperatures of etching solutions were investigated. A dilute sulfuric acid/peroxide (DSP) solution was used as a reference. The results of the DSP etching at different temperatures are presented in the table below and clearly indicate that the DSP solution is not suitable for removal of TiN at high etching rates while preserving aluminum structures.

TABLE

DSP Etching Results

| Temperature [C.] | TiN Etching Rate [A/min] | Al Etching Rate [A/min] | Selectivity Al/TiN |
|---|---|---|---|
| 30 | 2 | 33 | 16.5 |
| 50 | 31 | 122 | 3.9 |
| 70 | 125 | 275 | 2.2 |

Another reference test was conducted using an etching solution that did not have ammonium hydroxide. The 30% by weight hydrogen peroxide water-based solution was used at different temperatures. The results of the hydrogen peroxide etching are presented in the table below. For suitable processing temperatures, such as less than 80° C. the titanium nitride etching rate was lower than desired in some applications.

TABLE

Hydrogen Peroxide Etching Results

| Temperature [C.] | TiN Etching Rate [A/min] | Al Etching Rate [A/min] | Selectivity Al/TiN |
|---|---|---|---|
| 100 | 970.5 | 5.2 | 0.005 |
| 80 | 403.5 | 4.6 | 0.011 |
| 65 | 247.1 | 4.6 | 0.019 |
| 40 | 76.2 | — | — |

In another test, a 25% by weight water based solution of ammonium hydroxide was combined with a 30% by weight water based solution of hydrogen peroxide. The weight ratios presented in the table below (i.e., 600:1, 900:1, 1,200:1, and 1,500:1) represent the weight ratios of these two water-based solutions. The results of the combined etching (i.e., ammonium hydroxide and hydrogen peroxide) for two different temperatures and different solution weight ratios are presented below are presented in the table below. While the etching became less selective when ammonium hydroxide was added, the etching rates of titanium nitride increased substantially. For example, hydrogen peroxide without ammonium hydroxide yielded an etching rate of 247 Angstroms per minute at 65° C. (as indicated in the table above) while a combination of hydrogen peroxide ammonium hydroxide (800:1 weight ratio) yielded an etching rate of 399.2 Angstroms per minute (as indicated in the table below) at the same temperature or a 61% increase in the etching rate.

TABLE

Hydrogen Peroxide and Ammonium Hydroxide Etching Results

| H2O2: NH4OH | TiN Etching Rate [A/min] | Al Etching Rate [A/min] | Selectivity Al/TiN | SiGe Etching Rate [A/min] | Selectivity SiGe/TiN |
|---|---|---|---|---|---|
| Temperature of 65° C. | | | | | |
| 600:1 | 359.0 | 16.8 | 0.047 | 4.6 | 0.013 |
| 900:1 | 405.5 | 12.3 | 0.030 | 5.0 | 0.012 |
| 1,200:1 | 399.2 | 11.4 | 0.029 | 5.0 | 0.013 |
| 1,500:1 | 350.0 | 13.4 | 0.038 | 5.4 | 0.015 |
| Temperature of 50° C. | | | | | |
| 400:1 | 314.1 | 6.6 | 0.021 | 6.6 | 0.021 |
| 600:1 | 299.5 | 6.0 | 0.020 | 6.0 | 0.020 |
| 800:1 | 323.7 | 5.2 | 0.016 | 5.2 | 0.016 |
| 1000:1 | 334.0 | 4.2 | 0.013 | 4.2 | 0.013 |

Apparatus Examples

Figure 3:
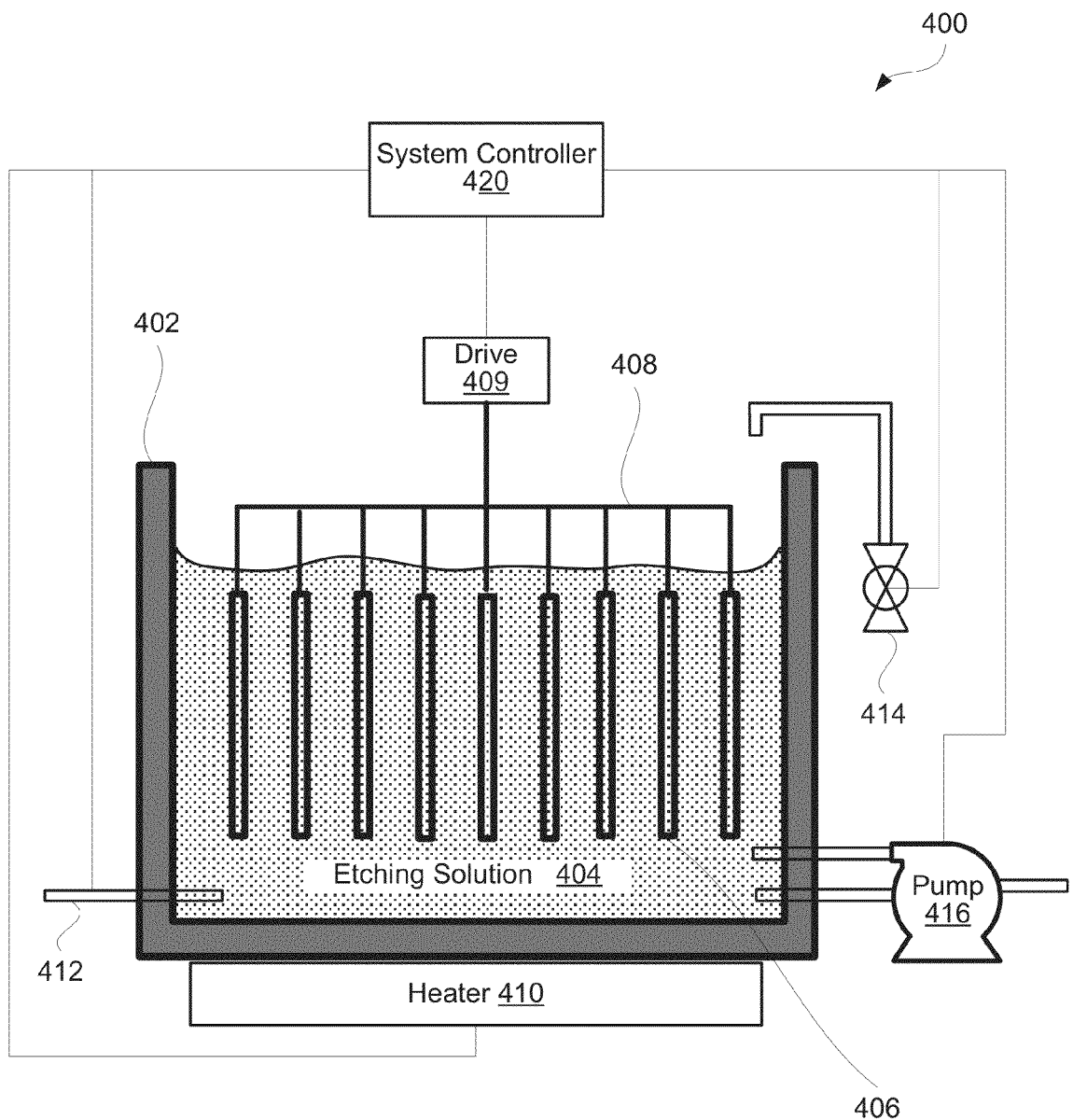
FIG. 3 illustrates a schematic representation of an etching apparatus for processing a semiconductor substrate to etch titanium nitride structures, in accordance with some embodiments.

FIG. 3 illustrates a schematic representation of etching apparatus 400 for processing a semiconductor substrate to selectively remove titanium nitride from the surface of the substrate, in accordance with some embodiments. For clarity, some components of apparatus 400 are not included in this figure. Apparatus 400 includes bath 402 for containing etching solution 404. One or more semiconductor substrates 406 may be submerged into etching solution 404 for processing or, more specifically, for removal of the described structures. Substrate 406 may be supported by substrate holder 408, which may be attached to drive 409 for moving substrate holder 408. Specifically, substrate holder 408 may be moved to submerge substrates 406 into etching solution 404 for processing, remove substrates 406 from etching solution 404 after processing, and/or to move substrates 406 within etching solution 404 during processing (e.g., to agitate etching solution 404).

Apparatus 400 also includes heater 410 and temperature sensor 412 (e.g., a thermocouple) for maintaining etching solution 404 at a predetermined temperature. Heater 410 and temperature sensor 412 may be connected to system controller 420, which may control power supplied to heater 410 based on signals received from temperature sensor 412. Various features of system controller 420 are described below.

Apparatus 400 may also include a liquid delivery system 414 for supplying additional liquids and controlling the composition of etching solution 404. For example, some components of etching solution 404 may evaporate from bath 402, and these components may be replenished in bath 402 by liquid delivery system 414. Liquid delivery system 414 may be connected to and controlled by system controller 420. Various sensors (e.g., conductivity sensor, weight sensor) may be used to provide signals about potential changes in composition of etching solution 404. Apparatus 400 may be also equipped with pump 416 for recirculating etching solution 404 in bath 402 and other purposes. Pump 416 may be also connected to and controlled by system controller 420.

Apparatus 400 may include system controller 420 for controlling process conditions during etching processes. Controller 420 may include one or more memory devices and one or more processors with a central processing unit (CPU) or computer, analog and/or digital input/output connections, stepper motor controller boards, and the like. In some embodiments, controller 420 executes system control software including sets of instructions for controlling timing of operations, temperature of etching solution 404, composition of etching solution 404, and other parameters. Other computer programs and instruction stored on memory devices associated with controller may be employed in some embodiments.

CONCLUSION

Although the foregoing concepts have been described in some detail for purposes of clarity of understanding, it will be apparent that some changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method for processing semiconductor substrates, the method comprising:
   providing a semiconductor substrate comprising a first structure and a second structure;
   exposing the semiconductor substrate to an etching solution; and
   etching the first structure;
      wherein the first structure comprises titanium nitride;
      wherein the second structure comprises aluminum;
      wherein the etching solution comprises ammonium hydroxide and hydrogen peroxide;
      wherein a weight ratio of ammonium hydroxide to hydrogen peroxide is between about 1:600 and about 1:3,000 such that ammonium hydroxide is operable as a catalyst during etching of the first structure;
      wherein an etching rate of the first structure is greater than an etching rate of the second structure;
      wherein the etching rate of the first structure is between 200 Angstroms per minute and 2,000 Angstroms per minute; and
      wherein the etching rate of the second structure is less than 15 Angstroms per minute.

2. The method of claim 1, wherein the etching rate of the first structure is between 350 Angstroms per minute and 2,000 Angstroms per minute.

3. The method of claim 1, wherein the etching rate of the second structure is less than 10 Angstroms per minute.

4. The method of claim 1, wherein an etching selectivity of the second structure to the first structure is less than 0.05.

5. The method of claim 1, wherein an etching selectivity of the second structure to the first structure is less than 0.03.

6. The method of claim 1, wherein the etching solution further comprises water having a concentration of between about 50% and about 80% by weight.

7. The method of claim 1, wherein the weight ratio of ammonium hydroxide and hydrogen peroxide is between 1:1,500 and 1:3,000.

8. The method of claim 1, wherein the etching solution is held at a temperature of between 25° C. and 80° C. during etching.

9. The method of claim 1, wherein the etching solution is held at a temperature of between 40° C. and 65° C. during etching.

10. The method of claim 1, wherein the etching solution is held at a temperature of between 50° C. and 60° C. during etching.

11. The method of claim 1, wherein the semiconductor substrate further comprises a third structure;
   wherein the third structure comprises one of silicon germanium, tantalum nitride, hafnium oxide, silicon nitride, or silicon dioxide; and
   wherein an etching rate of the third structure is less than 15 Angstroms per minute.

12. The method of claim 11, wherein the etching rate of the third structure is less than 6 Angstroms per minute.

13. The method of claim 11, wherein the third structure comprises silicon germanium.

14. The method of claim 1, wherein the first structure is a part of a hard mask.

15. The method of claim 1, wherein the second structure is a transistor contact.

16. The method of claim 1, wherein the second structure is a work function modulation layer.

17. The method of claim 1, wherein the etching solution further comprises 2-(2-aminoethoxy) ethanol, hydroxylamine, and catechol.

18. The method of claim 1, wherein the etching solution further comprises one or more of 2-(2-aminoethoxy) ethanol, hydroxylamine, or catechol.

19. The method of claim 1, further comprising, prior to exposing the semiconductor substrate to the etching solution, forming the protective layer over the second structure.

20. A method for processing semiconductor substrates, the method comprising:
   providing a semiconductor substrate;
   exposing the semiconductor substrate to an etching solution; and
   etching the titanium structure such that an etching selectivity of the aluminum structure to the titanium nitride structure is less than 0.03;
      wherein the semiconductor substrate comprises an aluminum structure and a titanium nitride structure;
      wherein the etching solution comprises ammonium hydroxide and hydrogen peroxide;
      wherein a weight ratio of ammonium hydroxide to hydrogen peroxide is between 1:600 and 1:3,000 such that ammonium hydroxide is operable as a catalyst during etching of the first structure;
      wherein the etching solution is kept at a temperature of between 40° C. and 65° C.
      wherein an etching rate of the first structure is greater than an etching rate of the second structure;
      wherein the etching rate of the first structure is between 200 Angstroms per minute and 2,000 Angstroms per minute; and
      wherein the etching rate of the second structure is less than 15 Angstroms per minute.

* * * * *